United States Patent
Tsai et al.

(10) Patent No.: US 10,825,898 B2
(45) Date of Patent: Nov. 3, 2020

(54) SEMICONDUCTOR LAYOUT STRUCTURE INCLUDING ASYMMETRICAL CHANNEL REGION

(71) Applicant: NANYA TECHNOLOGY CORPORATION, New Taipei (TW)

(72) Inventors: Jhen-Yu Tsai, Kaohsiung (TW); Tseng-Fu Lu, New Taipei (TW); Wei-Ming Liao, Taoyuan (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/720,796

(22) Filed: Dec. 19, 2019

(65) Prior Publication Data

US 2020/0127094 A1   Apr. 23, 2020

Related U.S. Application Data

(62) Division of application No. 15/866,888, filed on Jan. 10, 2018, now Pat. No. 10,559,661.
(Continued)

(51) Int. Cl.
*H01L 29/08* (2006.01)
*H01L 29/66* (2006.01)
(Continued)

(52) U.S. Cl.
CPC .. *H01L 29/0852* (2013.01); *H01L 21/823437* (2013.01); *H01L 27/0207* (2013.01);
(Continued)

(58) Field of Classification Search
CPC ............. H01L 29/0852; H01L 29/4238; H01L 21/823437; H01L 27/0207; H01L 29/0657;
(Continued)

(56) References Cited

U.S. PATENT DOCUMENTS 5,514,992 A * 5/1996 Tanaka .................. H03F 1/226
                                                         327/317
6,764,884 B1   7/2004 Yu et al.
(Continued)

FOREIGN PATENT DOCUMENTS

CN        1507064 A    6/2004
CN      102005481 A    4/2011
(Continued)

OTHER PUBLICATIONS

The Ministry of Econimic Affairs R.O.C, TW Application 107109087 Office Action with English statement of relevances, Nov. 2018, 7 pages (Year: 2018).*

(Continued)

*Primary Examiner* — Ismail A Muse
(74) *Attorney, Agent, or Firm* — Muncy, Geissler, Olds & Lowe, P.C.

(57) ABSTRACT

The semiconductor layout structure includes an active region surrounded by an isolation structure, at least one first gate structure disposed over the active region and the isolation structure, at least one second gate structure disposed over the active region and the isolation structure, and a plurality of source/drain regions disposed in the active region. The active region includes two first regions, a second region disposed between the two first regions, a third region disposed between one of the first region and the second region, and a fourth region disposed between the other first region and the second region.

8 Claims, 9 Drawing Sheets

Related U.S. Application Data

(60) Provisional application No. 62/593,373, filed on Dec. 1, 2017.

(51) Int. Cl.
    *H01L 27/088*     (2006.01)
    *H01L 29/78*     (2006.01)
    *H01L 29/423*     (2006.01)
    *H01L 21/8234*     (2006.01)
    *H01L 27/02*     (2006.01)
    *H01L 29/06*     (2006.01)

(52) U.S. Cl.
CPC ........ *H01L 27/088* (2013.01); *H01L 29/0657* (2013.01); *H01L 29/4238* (2013.01); *H01L 29/66659* (2013.01); *H01L 29/66681* (2013.01); *H01L 29/7816* (2013.01); *H01L 29/7835* (2013.01)

(58) Field of Classification Search
CPC ............. H01L 29/66659; H01L 27/088; H01L 29/7835; H01L 29/7816; H01L 29/66681
See application file for complete search history.

(56) References Cited

U.S. PATENT DOCUMENTS

| | | | |
|---|---|---|---|
| 7,504,270 B2 | 3/2009 | Wu et al. | |
| 7,820,530 B2 | 10/2010 | Min et al. | |
| 8,525,238 B2 | 9/2013 | Yoshida | |
| 8,716,768 B2 | 5/2014 | Lyu et al. | |
| 2003/0119230 A1* | 6/2003 | Chida | H01L 27/1214 438/149 |
| 2004/0238897 A1 | 12/2004 | Oishi | |
| 2008/0054346 A1 | 3/2008 | Saitoh et al. | |
| 2008/0185581 A1 | 8/2008 | Chen et al. | |
| 2008/0311718 A1 | 12/2008 | Futase | |
| 2009/0134475 A1 | 5/2009 | Min | |
| 2009/0159967 A1 | 6/2009 | Edwards et al. | |
| 2009/0212854 A1* | 8/2009 | Baumgartner | H01L 29/78 327/543 |
| 2011/0133205 A1 | 6/2011 | Nagahisa et al. | |
| 2012/0025325 A1* | 2/2012 | Baumgartner | H01L 29/66659 257/392 |
| 2012/0042296 A1* | 2/2012 | Baumgartner | H01L 29/78 716/119 |
| 2013/0167097 A1* | 6/2013 | Baumgartner | H01L 29/78 716/111 |
| 2015/0137262 A1 | 5/2015 | Baek et al. | |
| 2018/0102434 A1 | 4/2018 | He et al. | |
| 2019/0140096 A1* | 5/2019 | Huang | H01L 29/78 |

FOREIGN PATENT DOCUMENTS

| | | |
|---|---|---|
| CN | 102412303 A | 4/2012 |
| CN | 103715194 A | 4/2014 |
| DE | 102009000624 | 11/2009 |

OTHER PUBLICATIONS

Office Action dated Nov. 27, 2018 issued in correesponding TW Application 107109087, with English statement of relevances, 7 pages.

Office Action issued in corresponding CN application No. 201810443195.5, dated Jul. 20, 2020. (with partial English Translation).

* cited by examiner

SEMICONDUCTOR LAYOUT STRUCTURE INCLUDING ASYMMETRICAL CHANNEL REGION

CROSS-REFERENCE TO RELATED APPLICATION

This application is a divisional application of U.S. Non-Provisional application Ser. No. 15/866,888 filed Jan. 10, 2018, and claims the benefit of U.S. Provisional Patent Application No. 62/593,373 filed Dec. 1, 2017. The entire disclosures of which are hereby incorporated by reference.

TECHNICAL FIELD

The present disclosure relates to a transistor device and a semiconductor layout structure, and more particularly, to a transistor device and a semiconductor layout structure including an asymmetrical channel region.

DISCUSSION OF THE BACKGROUND

As semiconductor fabrication technology continues to improve, sizes of electronic devices are reduced, and the size and the channel length of the conventional planar channel transistor also decrease correspondingly. Although the conventional planar channel transistor has been widely used in integrated circuit design, the ongoing reduction of the size and the channel length of the conventional planar channel transistor creates increasing problems with interaction between the source/drain region and the carrier channel under the gate. For example, a boundary between an isolation structure and an active region results in a concentrated electric field. The concentrated electric field leads to leakage, which adversely affects the performance of the transistor. Therefore, there is a need to reduce leakage current and thus to improve the performance of the transistor.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a transistor device. The transistor device includes an active region disposed in a substrate, a gate structure disposed over the active region, and a source/drain region disposed at two opposite sides of the gate structure. The active region includes a first region, a second region and a third region between the first region and the second region. The first region includes a first length, the second region includes a second length, and the first length is greater than the second length. The gate structure includes a first portion extending in a first direction and a second portion extending in a second direction. The first direction and the second direction are perpendicular to each other. The first portion of the gate structure is disposed over at least the third region of the active region, and the second portion of the gate structure is disposed over at least a portion of the third region and a portion of the second region.

In some embodiments, the first region of the active region includes a first boundary and a second boundary. In some embodiments, the first boundary and the second boundary extend in the second direction. In some embodiments, the second region of the active region includes a third boundary and a fourth boundary. In some embodiments, the third boundary and the fourth boundary extend in the second direction. In some embodiments, the third region of the active region includes a fifth boundary and a sixth boundary. In some embodiments, the fifth boundary extends in the second direction.

In some embodiments, the first length of the first region is defined by a distance between the first boundary and the second boundary. In some embodiments, the second length of the second region is defined by a distance between the third boundary and the fourth boundary.

In some embodiments, the fifth boundary of the third region is in contact with the first boundary of the first region and the third boundary of the second region. In some embodiments, the sixth boundary of the third region is in contact with the second boundary of the first region and the fourth boundary of the second region.

In some embodiments, the sixth boundary of the third region extends in a third direction between the first direction and the second direction.

In some embodiments, a distance between a point on the fifth boundary of the third region and a point on the sixth boundary of the third region defines a third length equal to the first length of the first region. Meanwhile, a distance between another point on the fifth boundary and another point on the sixth boundary defines a fourth length equal to the second length of the second region.

In some embodiments, the first portion of the gate structure overlaps the sixth boundary of the third region.

In some embodiments, the second portion of the gate structure overlaps the sixth boundary of the third region.

In some embodiments, the first portion of the gate structure further overlaps a portion of the second region of the active region.

In some embodiments, the gate structure further includes a third portion, and the second portion and the third portion are disposed at two opposite ends of the first portion and are both physically in contact with the first portion.

In some embodiments, the third portion of the gate structure overlaps the third region and a portion of the second region.

In some embodiments, the source region is disposed in the first region, and the drain region is disposed in the second region.

Another aspect of the present disclosure provides a semiconductor layout structure. The semiconductor layout structure includes an active region surrounded by an isolation structure, at least one first gate structure disposed over the active region and the isolation structure, at least one second gate structure disposed over the active region and the isolation structure, and a plurality of source/drain regions disposed in the active region. The active region includes two first regions, a second region disposed between the two first regions, a third region disposed between one of the first region and the second region, and a fourth region disposed between the other first region and the second region. The first regions include a first length, the second region includes a second length, and the second length is less than the first length. The first gate structure includes a first portion and a second portion perpendicular to each other. The second gate structure includes a third portion parallel to the first portion and a fourth portion parallel to the second portion. The second portion of the first gate structure overlaps the third region and a portion of the second region. The fourth portion of the second gate structure overlaps the fourth region and a portion of the second region.

In some embodiments, the first gate structure and the second gate structure are point symmetrical with respect to a central point.

In some embodiments, the first portion of the first gate structure and the third portion of the second gate structure include a first distance therebetween, the first portion of the first gate structure and the fourth portion of the second gate structure include a second distance therebetween, and the second portion of the first gate structure and the third portion of the second gate structure include a third distance therebetween. In some embodiments, the first distance is greater than the second distance, and the first distance is greater than the third distance. In some embodiments, the second distance is equal to the third distance.

In some embodiments, the first portion of the first gate structure overlaps the third region, and the third portion of the second gate structure overlaps the fourth region.

In some embodiments, the first portion of the first gate structure overlaps a slanted boundary of the third region. In some embodiments, the fourth portion of the second gate structure overlaps a slanted boundary of the fourth region.

In some embodiments, the first gate structure further includes a fifth portion overlapping the third region and a portion of the second region. In some embodiments, the second gate structure further includes a sixth portion overlapping the fourth region and a portion of the second region.

In some embodiments, the first gate structure and the second gate structure are line symmetrical with respect to a central line. In some embodiments, the two first regions are line symmetrical with respect to a central line. In some embodiments, the third region and the fourth region are line symmetrical with respect to a central line.

In some embodiments, the first portion of the first gate structure and the third portion of the second gate structure include a first distance therebetween, the second portion of the first gate structure and the sixth portion of the second gate structure include a second distance therebetween, and the fifth portion of the first gate structure and the fourth portion of the second gate structure include a third distance therebetween. In some embodiments, the first distance is greater than the second distance, and the first distance is greater than the third distance. In some embodiments, the second distance is equal to the third distance.

In the present disclosure, a transistor device including a C-gate structure or an L-gate structure is provided. Consequently, the concentrated electric field is deflected, and thus leakage current is reduced. Further, the active region of the transistor device includes a third region overlapped by the L-gate structure or the C-gate structure. The third region includes a slanted boundary, and thus different channel lengths are formed. Accordingly, drain current (Ids) is increased, and off current (Ioff) is reduced. In other words, driving current is increased while leakage current is reduced. Consequently, performance of the transistor device is improved while power consumption of the transistor device is reduced.

In contrast, with a comparative transistor device or semiconductor layout structure including a straight gate structure, the device suffers from greater leakage current and thus higher power consumption. Further, with a comparative transistor device or semiconductor layout structure including the channel region with only one length, the drain current is relatively lower. The transistor device therefore suffers from inferior performance.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
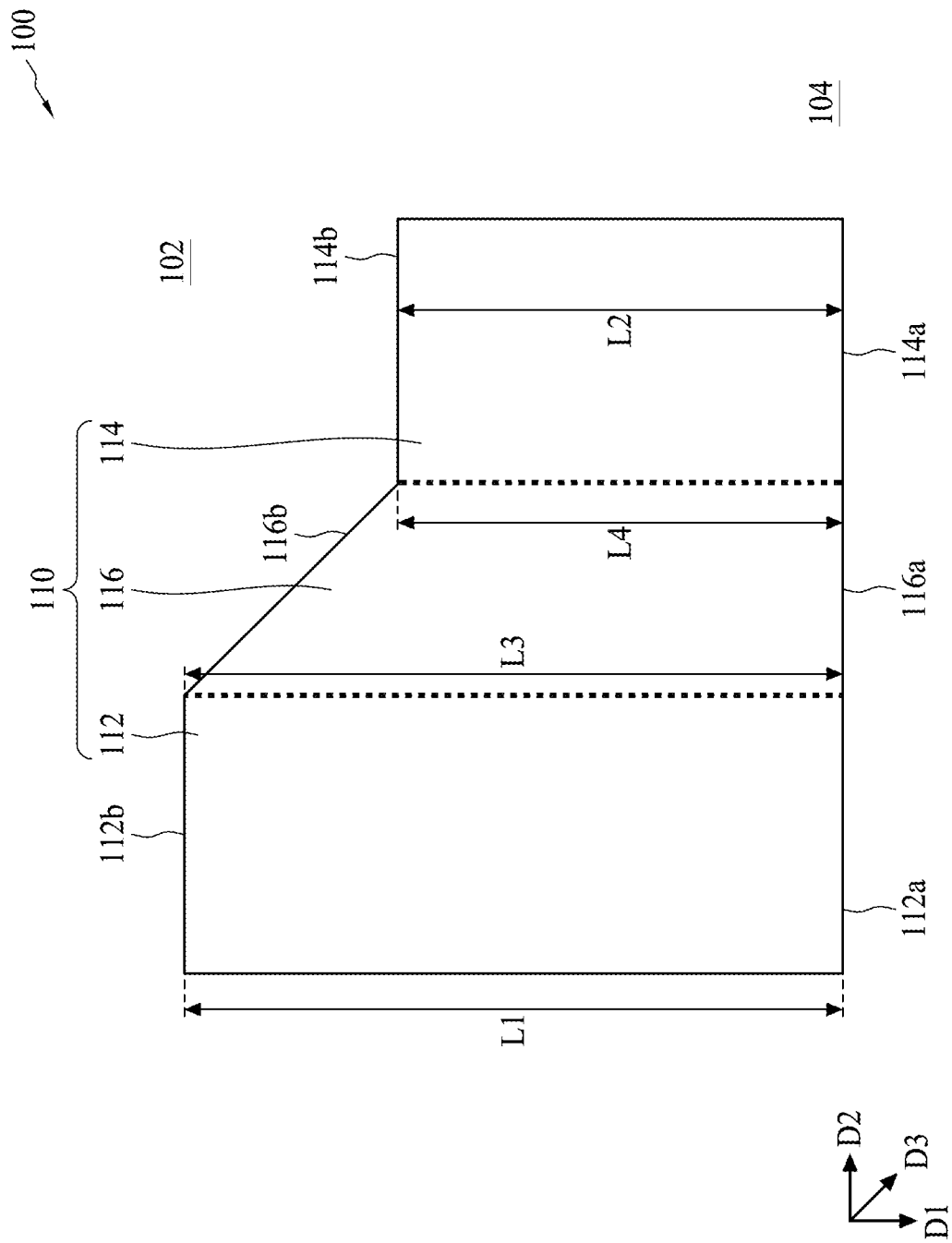
FIG. 1 is a schematic drawing illustrating a portion of a transistor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the terms "patterning" and "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch or other removal process. The mask can be a photoresist, or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

As used herein, the term "n-type doped" refers to the addition of electron-increasing dopants/impurities including, for example but not limited to, V or VI group atoms into a material matrix in order to manipulate the carrier numbers. As used herein, the term "p-type doped" refers to the addition of hole-increasing dopants/impurities including, for example but not limited to, II or III group atoms into a material matrix in order to manipulate the carrier numbers.

Figure 2:
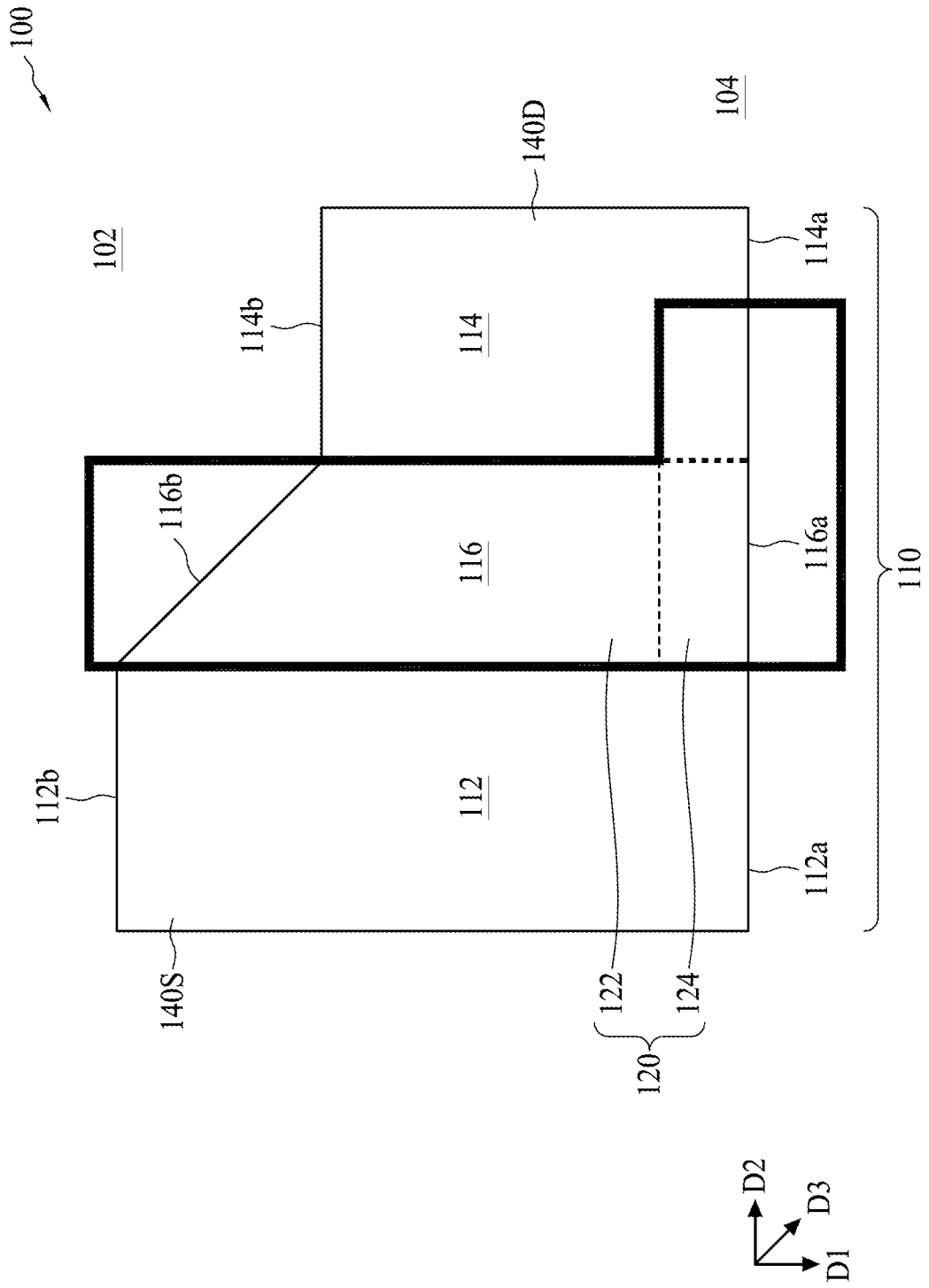
FIG. 2 is a schematic drawing illustrating the transistor device in accordance with some embodiments of the present disclosure.

FIG. 1 is a schematic drawing illustrating a portion of a transistor device in accordance with some embodiments of the present disclosure, and FIG. 2 is a schematic drawing illustrating the transistor device. In some embodiments, a transistor device 100 is provided. The transistor device 100 includes a substrate 102. The substrate 102 may include silicon (Si), silicon germanium (SiGe), gallium arsenide (GaAs), or other suitable semiconductor material. A well region (not shown) may be formed in the substrate 102. The well region may be neutral, or may be an n-type or p-type doped region, depending on the conductivity type of the transistor device 100. An isolation structure 104 such as a shallow trench isolation (hereinafter abbreviated as STI) structure is formed in the substrate 102 for defining at least an active region 110.

In some embodiments, the isolation structure 104 can be formed by the following steps. A pad oxide layer (not shown) is formed over the substrate 102. Next, a pad nitride layer (not shown) is formed. The pad oxide layer reduces stress on the substrate 102 from the pad nitride layer. Next, a patterned photoresist layer (not shown) defining a location of the isolation structure 104 is formed on the pad nitride layer. A portion of the pad nitride layer, a portion of the pad oxide layer and a portion of the substrate 102 exposed through the patterned photoresist layer are then removed, and a shallow trench (not shown) is formed in the substrate 102. After removal of the patterned photoresist layer, sidewalls and a bottom of the shallow trench are lined by an oxide liner (not shown) and the shallow trench is filled with an insulating material such as oxide. For example, a high density plasma chemical vapor deposition oxide (HDP oxide) can be used to fill the shallow trench, but the disclosure is not limited thereto. Subsequently, a planarization process is performed to remove superfluous oxide with the pad nitride layer serving as a stop layer. Next, the well region can be formed in the substrate 102, and the pad nitride layer and the pad oxide layer can subsequently be removed. Consequently, the transistor device 100 includes the isolation structure 104 defining and surrounding the active region 110 as shown in FIG. 1.

It should be noted that the active region 110 disposed in the substrate 102 includes a first region 112, a second region 114 and a third region 116 between the first region 112 and the second region 114 as shown in FIG. 1. The first region 112 includes a first length L1, the second region 114 includes a second length L2, and both of the first length L1 and the second length L2 extend in a first direction D1. In some embodiments, the first length L1 is greater than the second length L2. A width of the first region 112 can be equal to or greater than a width of the second region 114. In some embodiments, the width of the first region 112 and the width of the second region 114 are both greater than a width of the third region 116. The first region 112 includes a first boundary 112a and a second boundary 112b. The first boundary 112a and the second boundary 112b both extend in a direction D2, which is perpendicular to the first direction D1. The second region 114 includes a third boundary 114a and a fourth boundary 114b. The third boundary 114a and the fourth boundary 114b both extend in the second direction D2. The third region 116 includes a fifth boundary 116a and a sixth boundary 116b. In some embodiments, the fifth boundary 116a extends in the second direction D2. As shown in FIG. 1, the first boundary 112a of the first region 112, the third boundary 114a of the second region 114, and the fifth boundary 116a of the third region 116 are collinear with each other. Further, the fifth boundary 116a of the third region 116 is in contact with the first boundary 112a of the first region 112 and the third boundary 114a of the second region 114. The sixth boundary 116b of the third region 116 is in contact with the second boundary 112b of the first region 112 and the fourth boundary 114b of the second region 114. As shown in FIG. 1, the first length L1 of the first region 112 is defined by a distance between the first boundary 112a and the second boundary 112b, and the second length L2 of the second region 114 is defined by a distance between the third boundary 114a and the fourth boundary 114b. The sixth boundary 116b of the third region 116 connecting the second boundary 112b and the fourth boundary 114b extends in a third direction D3 between the first direction D1 and the second direction D2. In some embodiments, a distance between a point on the fifth boundary 116a and a point on the sixth boundary 116b of the third region 116 defines a third length L3 equal to the first length L1 of the first region 112. Meanwhile, a distance between another point on the fifth boundary 116a and another point on the sixth boundary 116b defines a fourth length L4 equal to the second length L2 of the second region 114. It should be easily understood that the third direction D3 is determined by a length difference between the third length L3 and fourth length L4 of the third region 116. In other words, the third direction D3 is determined by a length difference between the first length L1 of the first region 112 and the second length L2 of the second region 114. Further, the sixth boundary 116*b* is therefore a slanted boundary as shown in FIG. 1.

Referring to FIGS. 1 and 2, a gate structure 120 is next disposed over the substrate 102. The gate structure 120 can be formed by the following steps. For example, a gate dielectric layer (not shown) is formed over the substrate 102 and a gate conductive layer (not shown) is formed on the gate dielectric layer, but the disclosure is not limited thereto. In some embodiments, the gate dielectric layer can include dielectric material having high dielectric constant (high-k). For example, the gate dielectric layer can include silicon oxide (SiO), silicon nitride (SiN), silicon oxynitride (SiON), metal oxide such as hafnium oxide (HfO), or other suitable material chosen for compatibility, but the disclosure is not limited thereto. The gate conductive layer can include polysilicon or other suitable material such as metal materials with proper work function. Next, the gate conductive layer and the gate dielectric layer are patterned to form the gate structure 120 including an L shape in some embodiments. As shown in FIG. 2, the gate structure 120 is disposed over the active region 110 and a portion of the isolation structure 102. However, in some embodiments, the gate structure 120 can be formed by an optical proximity correction (OPC). For example, the OPC is performed to enlarge an end portion of the pattern feature, and thus an L-shaped pattern feature can be obtained. Consequently, the L-shaped pattern feature can be transferred to the gate conductive layer and the gate dielectric layer, and thus an L-shaped gate structure 120 is obtained, as shown in FIG. 2. Thereafter, lightly-doped drains (LDDs) (not shown) are formed in the active region 110 and a spacer (not shown) is formed over sidewalls of the gate structure 120. Next, a source/drain region 140S/140D is formed in the active region 110 at two opposite sides of the gate structure 120. The source/drain region 140S/140D includes an n-type or a p-type doped region, depending on the conductivity type of the transistor device 100. According to some embodiments of the disclosure, the source region 140S is disposed in the first region 112, and the drain region 140D is disposed in the second region 114. In some embodiments, a width of the source region 140S is equal to a width of the drain region 140D, and a length of the source region 140S (i.e., the first length L1) is greater than a length of the drain region 140D (i.e., the second length L2). Therefore, a surface area of the source region 140S is greater than a surface area of the drain region 140D, but the disclosure is not limited thereto.

Still referring to FIG. 2, the gate structure 120 includes a first portion 122 extending in the first direction D1 and a second portion 124 extending in the second direction D2. In other words, the first portion 122 is perpendicular to the second portion 124. More importantly, the first portion 122 of the gate structure 120 is disposed over the third region 116 of the active region 110 and a portion of the isolation structure 104. The second portion 124 of the gate structure 120 is disposed over a portion of the third region 116, a portion of the second region 114, and a portion of the isolation structure 104. Further, the first portion 122 of the gate structure 120 overlaps the sixth boundary 116*b* of the third region 116 of the active region 110.

Figure 3:
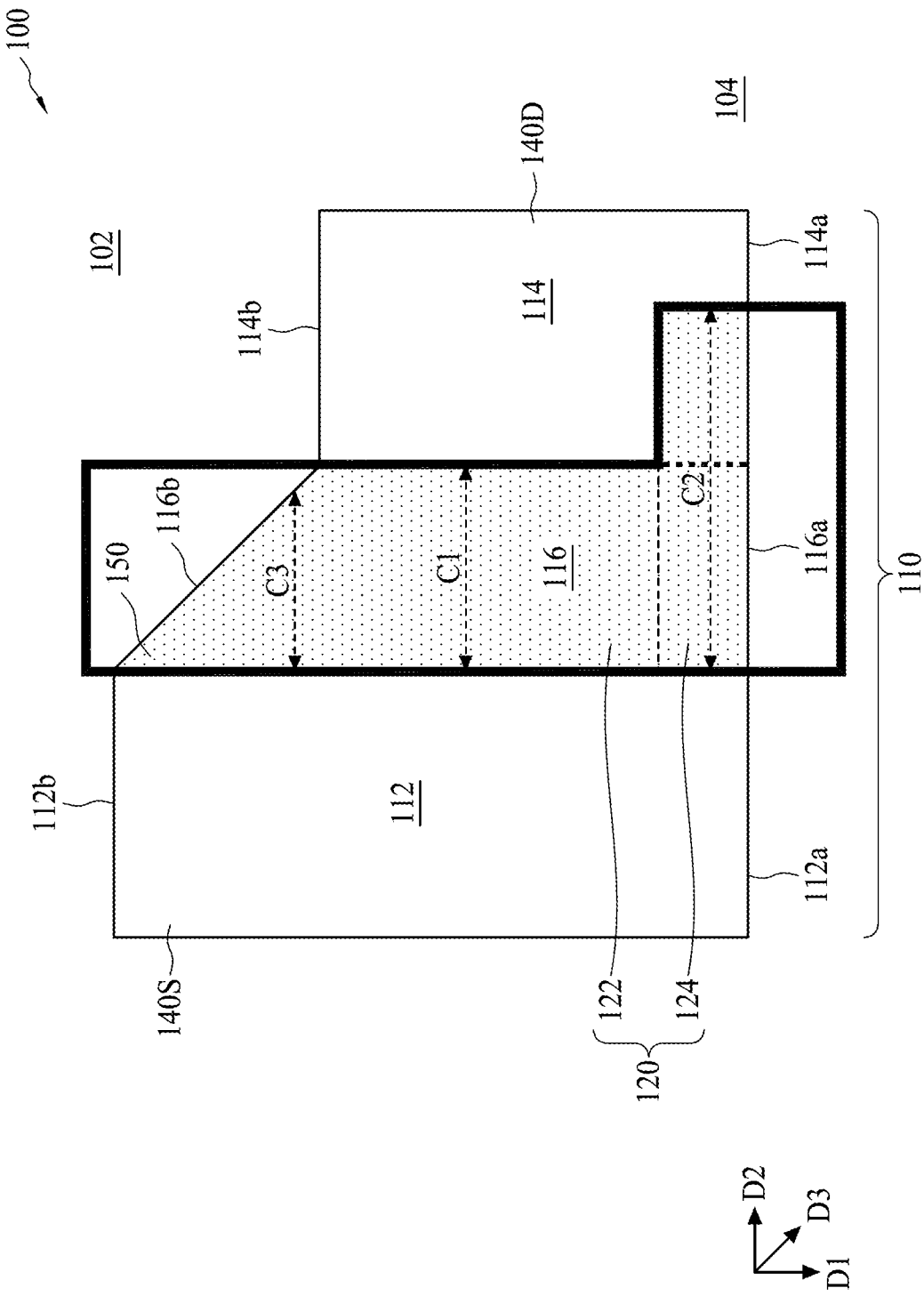
FIG. 3 is a schematic drawing illustrating the transistor device in accordance with some embodiments of the present disclosure.

Referring to FIG. 3, the transistor device 100 includes a channel region 150 under the gate structure 120. It should be noted that the channel region 150 is formed in the active region 110 overlapped by the gate structure 120. Therefore, the channel region 150 of the transistor 100 includes a first channel length C1, a second channel length C2, and a third channel length C3 as shown in FIG. 3. The first channel length C1 is substantially equal to the width of the third region 116. The second channel length C2 is substantially equal to a sum of the width of the third region 116 and the width of the portion of the second region 114 overlapped by the second portion 124 of the gate structure 120. The third channel length C3 is less than the first channel length C1. More importantly, the third channel length C3 is variable due to the slanted boundary 116*b* of the third region 116.

In the transistor device 100 provided by the present disclosure, the concentrated electric field is deflected from the second portion 124 of the gate structure 120. Accordingly, leakage current is reduced, and thus power consumption of the transistor device 100 is improved. Further, drain current (Ids) is improved by the variable third channel length C3, and thus performance of the transistor device is improved.

Figure 4:
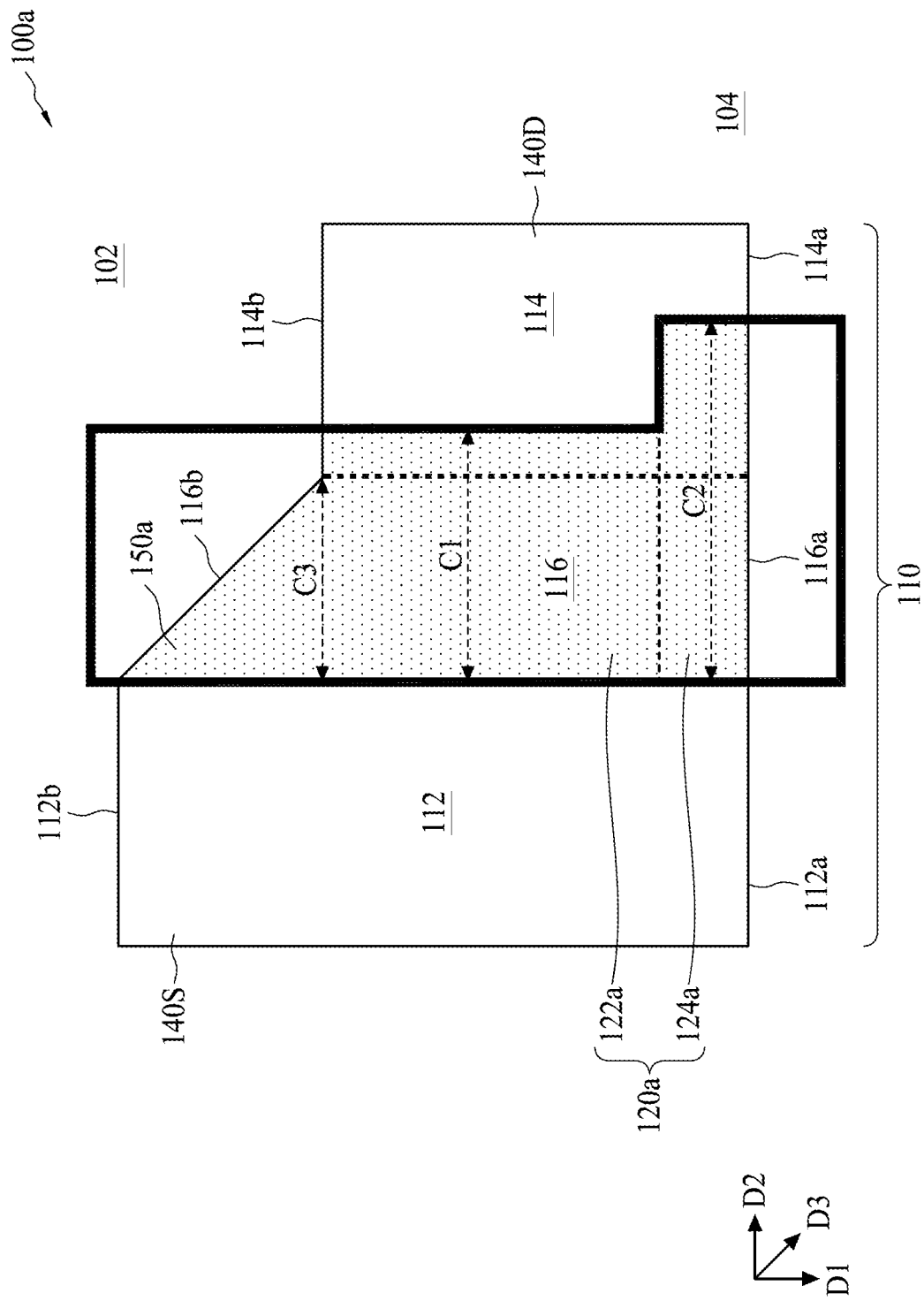
FIG. 4 is a schematic drawing illustrating a transistor device in accordance with some embodiments of the present disclosure.

FIG. 4 is a schematic drawing illustrating a transistor device in accordance with some embodiments of the present disclosure. It should be understood that similar features in FIGS. 3 and 4 can include similar materials and be formed by similar processes, and thus such details are omitted in the interest of brevity. In some embodiments, a transistor device 100*a* is provided. The transistor device 100*a* includes a substrate 102, and a well region (not shown) may be formed in the substrate 102. The well region may be neutral, or an n-type or p-type doped region, depending on the conductivity type of the transistor device 100*a*. An isolation structure 104 such as an STI structure is formed in the substrate for defining and surrounding at least one active region 110. As mentioned above, the active region 110 includes a first region 112 including a first length L1, a second region 114 including a second length L2 less than the first length L1, and a third region 116 between the first region 112 and the second region 114.

Referring to FIG. 4, the transistor 100*a* includes a gate structure 120*a*, and a source/drain region 140S/140D disposed at two opposite sides of the gate structure 120*a*. The source/drain region 140S/140D include an n-type or a p-type doped region, depending on the conductivity type of the transistor device 100*a*. The gate structure 120*a* is disposed over the active region 110 and the isolation structure 104. As mentioned above, the gate structure 120*a* includes a gate conductive layer and a gate dielectric layer disposed between the gate conductive layer and the substrate. In some embodiments, the gate structure 120*a* includes a first portion 122*a* extending in a first direction D1 and a second portion 124*a* extending in a second direction D2 perpendicular to the first direction D1. The second portion 124*a* overlaps a portion of the third region 116, a portion of the second region 114, and a portion of the isolation structure 104. According to the embodiments of the disclosure, the first portion 122*a* of the gate structure 120*a* overlaps the third region 116, a portion of the isolation structure 104, and a portion of the second region 114. In some embodiments, both of the first portion 122*a* and the second portion 124*a* can be formed to overlap a portion of the first region 112, but the disclosure is not limited thereto.

Referring to FIG. 4, the transistor device 100*a* includes a channel region 150*a* under the gate structure 120*a*. It should be noted that the channel region 150*a* is formed in the active region 110 overlapped by the gate structure 120*a*. Therefore, the channel region 150*a* of the transistor 100*a* includes a first channel length C1, a second channel length C2, and a third channel length C3 as shown in FIG. 4. The first channel length C1 is substantially equal to a sum of a width of the third region 116 and a width of the portion of the second region 114 overlapped by the first portion 122a of the gate structure 120a. The second channel length C2 is substantially equal to a sum of the width of the third region 116 and a width of the portion of the second region 114 overlapped by the second portion 124a of the gate structure 120a. The third channel length C3 is less than the first channel length C1. More importantly, the third channel length C3 is variable due to the slanted boundary 116b of the third region 116.

In the transistor device 100a provided by the present disclosure, the concentrated electric field is deflected from the second portion 124a of the gate structure 120a. Accordingly, leakage current is reduced, and thus power consumption of the transistor device 100a is improved. Further, drain current (Ids) is improved by the variable third channel length C3, and thus performance of the transistor device 100a is improved.

Figure 5:
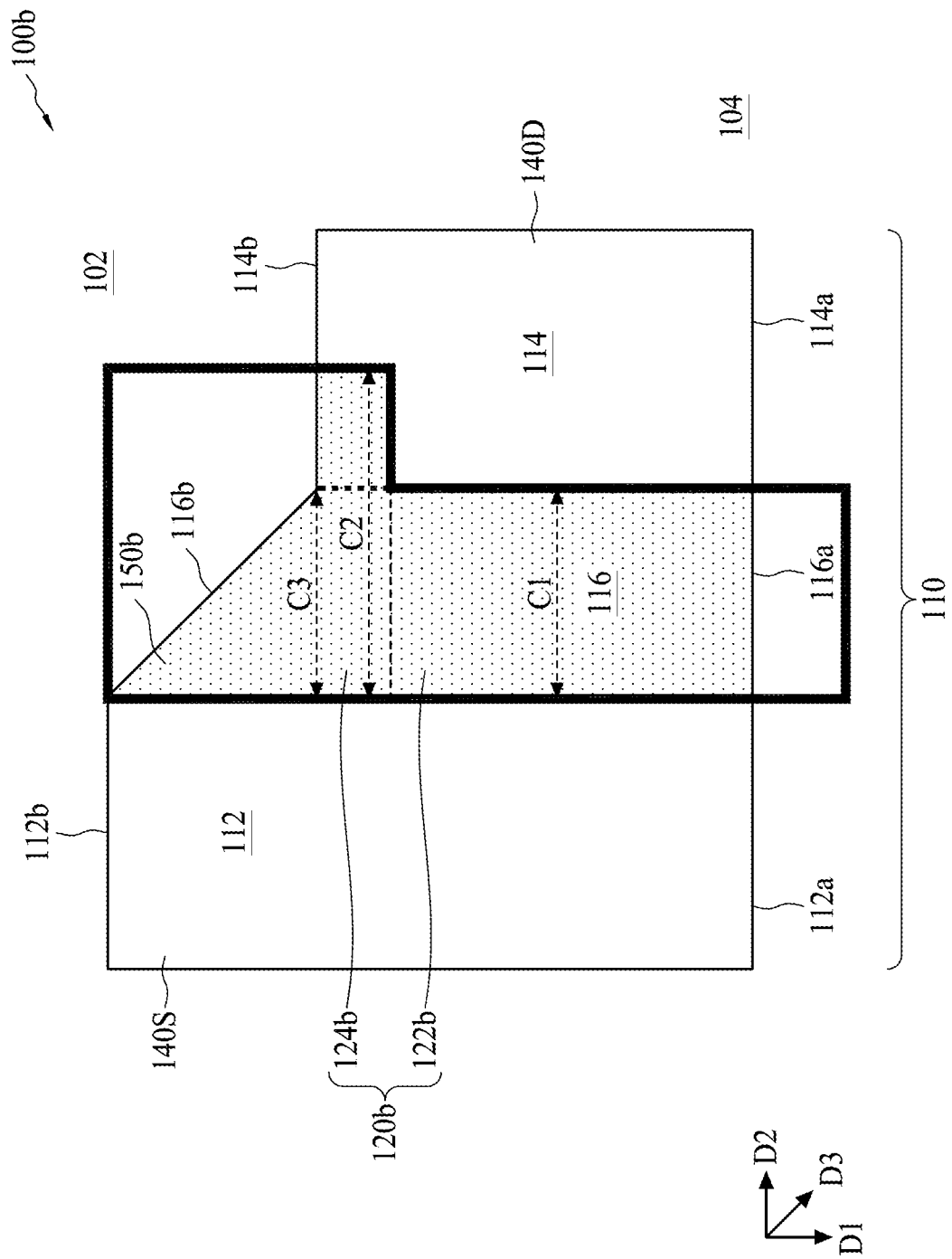
FIG. 5 is a schematic drawing illustrating a transistor device in accordance with some embodiments of the present disclosure.

FIG. 5 is a schematic drawing illustrating a transistor device 100b in accordance with some embodiments of the present disclosure. It should be noted that same elements in FIGS. 3 and 5 are designated by the same numerals and can be formed by same processes. Therefore, only differences are detailed. In some embodiments, the transistor device 100b includes a gate structure 120b disposed over the active region 110 and the isolation structure 104. The gate structure 120b includes a first portion 122b extending in the first direction D1 and a second portion 124b extending in the second direction D2. As shown in FIG. 5, the gate structure 120b is also an L-gate structure. The first portion 122b is disposed over the third region 116 and a portion of the isolation structure 104, and the second portion 124b is disposed over a portion of the third region 116, a portion of the second portion 114, and a portion of the isolation structure 104. Further, the second portion 124b of the gate structure 120b overlaps the sixth boundary 116b of the third region 116.

Still referring to FIG. 5, the transistor device 100b includes a channel region 150b under the gate structure 120b. It should be noted that the channel region 150b is formed in the active region 110 overlapped by the gate structure 120b. Therefore, the channel region 150b of the transistor 100b includes a first channel length C1, a second channel length C2, and a third channel length C3 as shown in FIG. 5. The first channel length C1 is substantially equal to a width of the third region 116. The second channel length C2 is substantially equal to a sum of the width of the third region 116 and a width of the portion of the second region 114 overlapped by the second portion 124b. The third channel length C3 is less than the first channel length C1. More importantly, the third channel length C3 is variable due to the slanted boundary 116b of the third region 116.

In the transistor device 100b provided by the present disclosure, the concentrated electric field is deflected from the second portion 124b of the gate structure 120b. Accordingly, leakage current is reduced, and thus power consumption of the transistor device 100b is improved. Further, drain current (Ids) is improved by the variable third channel length C3, and thus performance of the transistor device 100b is improved.

Figure 6:
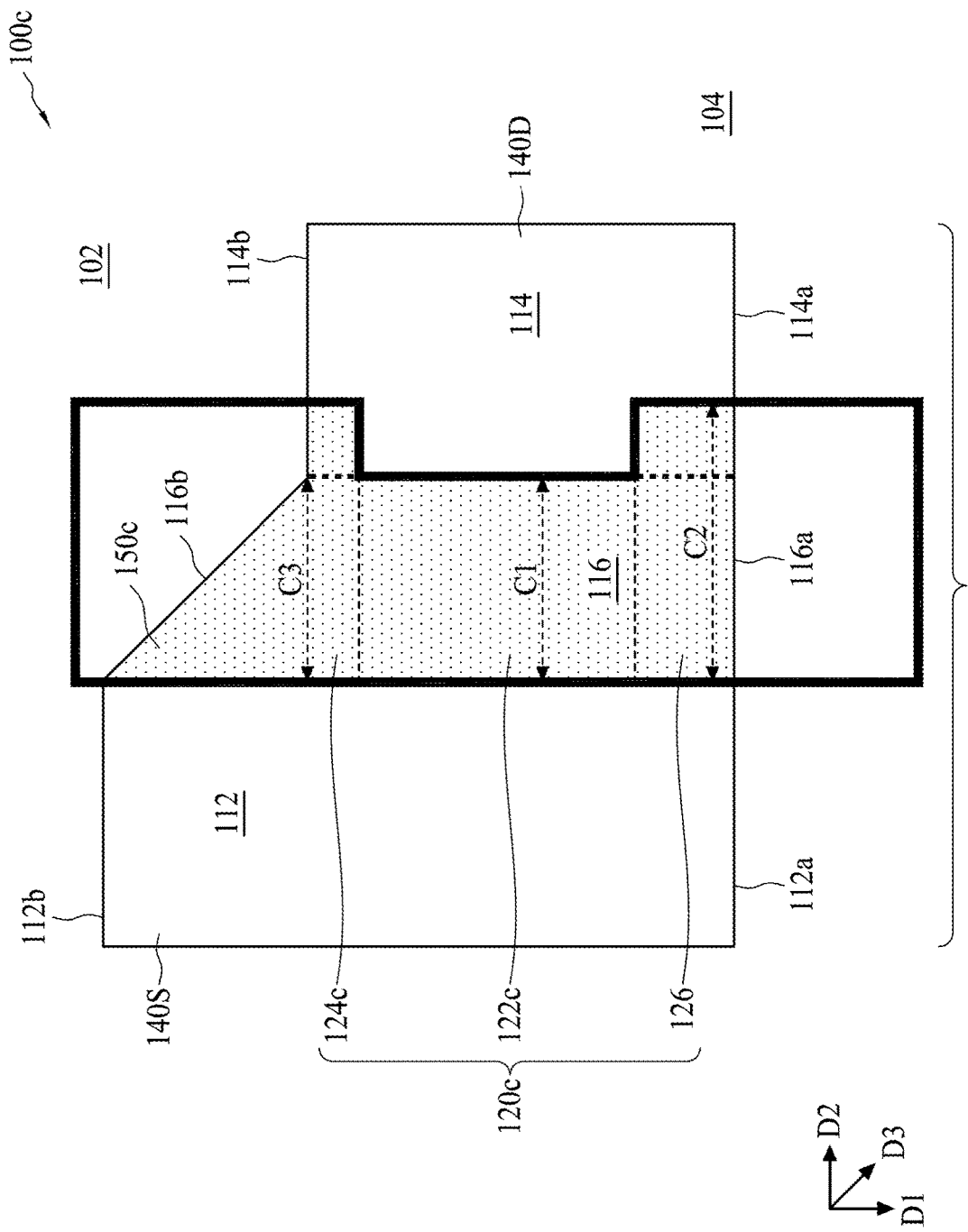
FIG. 6 is a schematic drawing illustrating a transistor device in accordance with some embodiments of the present disclosure.

FIG. 6 is a schematic drawing illustrating a transistor device 100c in accordance with some embodiments of the present disclosure. It should be noted that same elements in FIGS. 3 and 6 are designated by the same numerals and can be formed by same processes. Therefore, only differences are detailed. In some embodiments, the transistor device 100c includes a gate structure 120c disposed over the active region 110 and the isolation structure 104. The gate structure 120c includes a first portion 122c extending in the first direction D1, a second portion 124c extending, in the second direction D2 and a third portion 126 extending in the second direction D2. Further, the second portion 124c and the third portion 126 are disposed at two opposite ends of the first portion 122c, and are both physically in contact with the first portion 122c, as shown in FIG. 6. Accordingly, the gate structure 120c of the transistor device 100c is a C-gate structure. The first portion 122c overlaps only the third region 116. The second portion 124c overlaps a portion of the third region 116, a portion of the second portion 114 and a portion of the isolation structure 104. The third portion 126 overlaps a portion of the third region 116, a portion of the second region 114 and a portion of the isolation structure 104. Further, the second portion 124b of the gate structure 120b overlaps the sixth boundary 116b of the third region 116.

Still referring to FIG. 6, the transistor device 100c includes a channel region 150c under the gate structure 120c. It should be noted that the channel region 150c is formed in the active region 110 overlapped by the gate structure 120c. Therefore, the channel region 150c of the transistor 100c includes a first channel length C1, a second channel length C2, and a third channel length C3 as shown in FIG. 6. The first channel length C1 is substantially equal to a width of the third region 116. The second channel length C2 is substantially equal to a sum of the width of the third region 116 and a width of the portion of the second region 114 overlapped by the second portion 124c or overlapped by the third portion 126. The third channel length C3 is less than the first channel length C1. More importantly, the third channel length C3 is variable due to the slanted boundary 116b of the third region 116.

In the transistor device 100c provided by the present disclosure, the concentrated electric field is deflected from the second portion 124c and the third portion 126 of the gate structure 120c. Accordingly, leakage current is reduced, and thus power consumption of the transistor device 100c is improved. Further, drain current (Ids) is improved by the variable third channel length C3, and thus performance of the transistor device 100c is improved.

Figure 7:
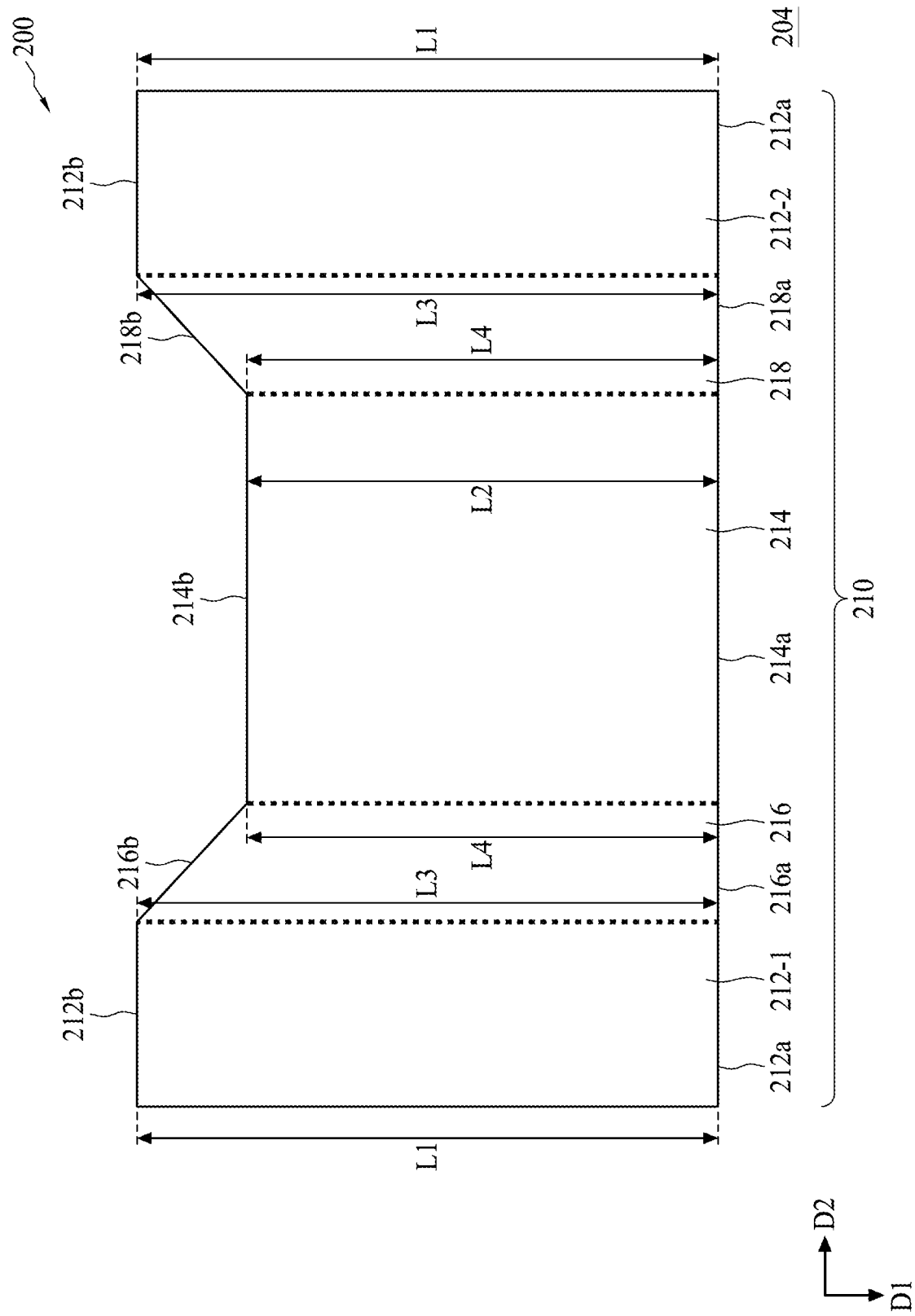
FIG. 7 is a schematic drawing illustrating a portion of a semiconductor layout structure in accordance with some embodiments of the present disclosure.
Figure 8:
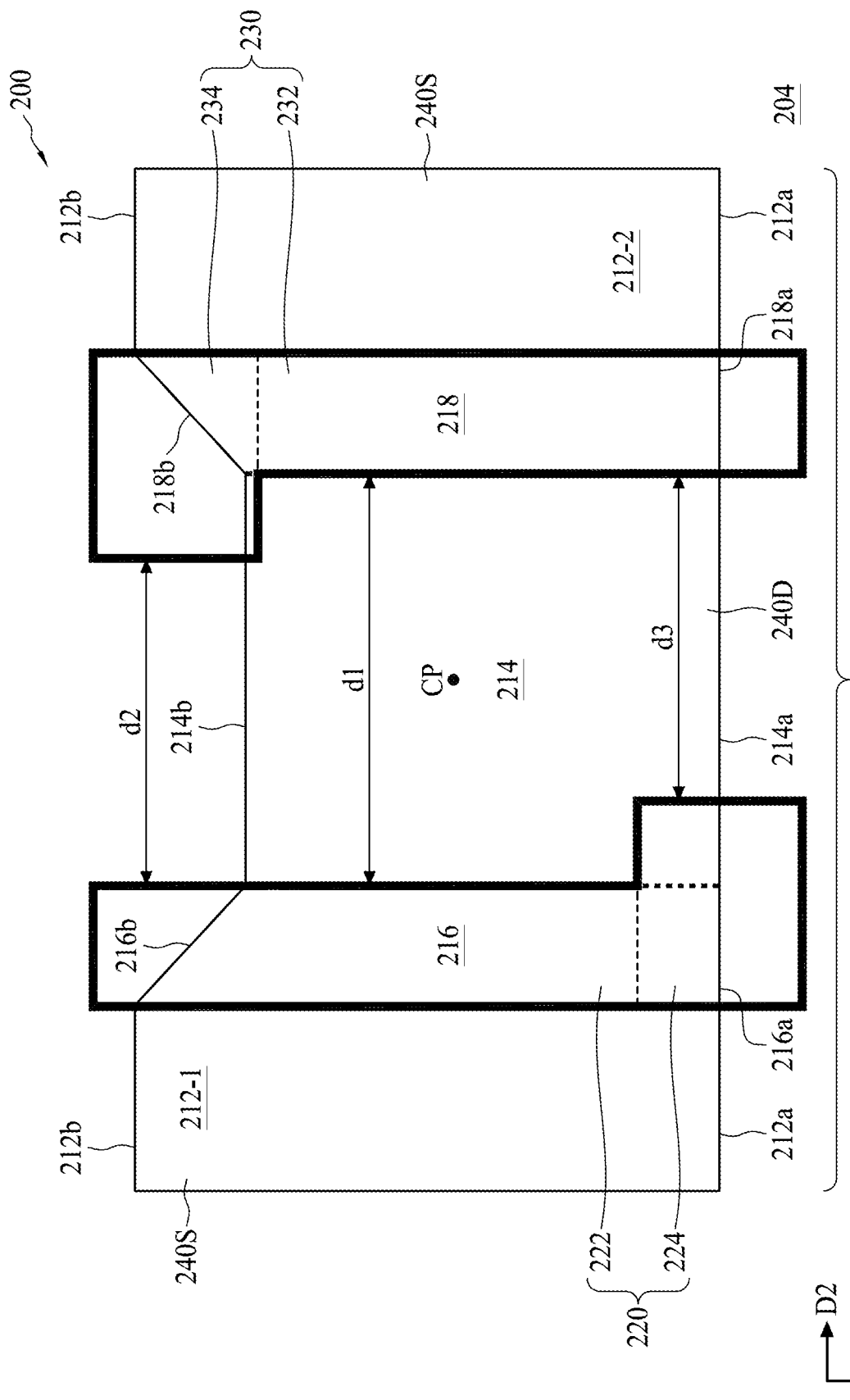
FIG. 8 is a schematic drawing illustrating a semiconductor layout structure in accordance with some embodiments of the present disclosure.

FIG. 7 is a schematic drawing illustrating a portion of a semiconductor layout structure 200 in accordance with some embodiments of the present disclosure, and FIG. 8 is a schematic drawing illustrating the semiconductor layout structure 200. In some embodiments of the present disclosure, the semiconductor layout structure 200 includes an active region 210 surrounded by an isolation structure 204. The active region 210, as mentioned above, can be an n-type or a p-type doped region, depending on the conductivity type of the semiconductor layout structure 200. The active region 210 includes two first regions 212-1 and 212-2, a second region 124 disposed between the two first regions 212-1 and 212-2, a third region 216 disposed between the second region 214 and the first region 212-1, and a fourth region 218 disposed between the second region 214 and the first region 212-2. The two first regions 212-1 and 212-2 include a first length L1, the second region 214 includes a second length L2, and both of the first length L1 and the second length L2 extend in a first direction D1. In some embodiments, the second length L2 is less than the first length L1. A width of the two first regions 212-1 and 212-2 can be equal to or greater than a width of the second region 214. In some embodiments, the width of the two first regions 212-1 and 212-2 can be less than the width of the second region 214, as shown in FIG. 7. In some embodiments, the width of the two first regions 212-1 and 212-2 and the width of the second region 214 are greater than a width of the third region 216 and a width of the fourth region 218. In some embodiments, each of the two first regions 212-1 and 212-2 includes both a first boundary 212a and a second boundary 212b. Both the first boundary 212a and the second boundary 212b extend in a direction D2, which is perpendicular to the first direction D1. The second region 214 includes a third boundary 214a and a fourth boundary 214b. Both the third boundary 214a and the fourth boundary 214b extend in the second direction D2. The third region 216 includes a fifth boundary 216a and a sixth boundary 216b. The fifth boundary 216a extends in the second direction D2. The fourth region 218 includes a seventh boundary 218a and an eighth boundary 218b. The seventh boundary 218a extends in the second direction D2. As shown in FIG. 7, the first boundary 212a of the first region 212, the third boundary 214a of the second region 214, the fifth boundary 216a of the third region 216, and the seventh boundary 218a of the fourth region 218 are collinear with to each other. Further, the fifth boundary 216a of the third region 216 is in contact with the first boundary 212a of the first region 212-1 and the third boundary 214a of the second region 214. The seventh boundary 218a of the fourth region 218 is in contact with the first boundary 212a of the first region 212-2 and the third boundary 214a of the second region 214. The sixth boundary 216b of the third region 216 is in contact with the second boundary 212b of the first region 212-1 and the fourth boundary 214b of the second region 214. The eighth boundary 218b of the fourth region 218 is in contact with the second boundary 212b of the first region 212-2 and the fourth boundary 214b of the second region 214. As shown in FIG. 7, the first lengths L1 of the first regions 212-1 and 212-2 are defined by a distance between the first boundary 212a and the second boundary 212b, and the second length L2 of the second region 214 is defined by a distance between the third boundary 214a and the fourth boundary 214b. In some embodiments, a distance between a point on the fifth boundary 216a and a point on the sixth boundary 216b of the third region 216 defines a third length L3 equal to the first length L1 of the first region 212-1, and a distance between a point on the seventh boundary 218a and a point on the eighth boundary 218b of the fourth region 218 defines the third length L3 equal to the first length L1 of the first region 212-2. A distance between another point on the fifth boundary 216a and another point on the sixth boundary 216b of the third region 216 defines a fourth length L4, which is also equal to a distance between another point on the seventh boundary 218a and another point on the eighth boundary 218b of the fourth region 218. The fourth length L4 is equal to the second length L2 of the second region 214. As shown in FIG. 7, the sixth boundary 216b of the third region 216 and the eighth boundary 218b of the fourth region 218 are slanted boundaries.

Referring to FIG. 8, the semiconductor layout structure 200 includes at least one first gate structure 220 disposed over the active region 210 and the isolation structure 204, at least one second gate structure 230 disposed over the active region 210 and the isolation structure 204, and a plurality of source/drain regions 240S/240D disposed in the active region 210. As mentioned above, the source/drain regions 240S/240D can be n-type or p-type doped regions, depending on the conductivity type of the semiconductor layout structure 200. The first gate structure 220 includes a first portion 222 extending in the first direction D1 and a second portion 224 extending in the second direction D2. The first direction D1 is perpendicular to the second direction D2. In other words, the first portion 222 of the first gate structure 220 and the second portion 224 of the first gate structure 220 are perpendicular to each other. The second gate structure 230 includes a third portion 232 parallel to the first portion 222 and a fourth portion 234 parallel to the second portion 224. In some embodiments, a width of the second portion 224 of the first gate structure 220 is greater than a width of the first portion 222 of the first gate structure 220, and a width of the fourth portion 234 of the second gate structure 230 is greater than a width of the third portion 232 of the second gate structure 230. In some embodiments, the width of the first portion 222 of the first gate structure 220 is equal to the width of the third portion 232 of the second gate structure 230, but the disclosure is not limited thereto. In some embodiments, the width of the second portion 224 of the first gate structure 220 is equal to the width of the fourth portion 234 of the second gate structure 230, but the disclosure is not limited thereto.

In some embodiments, the second portion 224 of the first gate structure 220 overlaps the third region 216, a portion of the second region 214 and a portion of the isolation structure 204. In some embodiments, the fourth portion 234 of the second gate structure 230 overlaps a portion of the fourth region 218, a portion of the second region 214 and a portion of the isolation structure 204. The first portion 222 of the first gate structure 220 overlaps the third region 216 and a portion of the isolation structure 204, and the third portion 232 of the second gate structure 230 overlaps the fourth region 218 and a portion of the isolation structure 204. Further, the first portion 222 of the first gate structure 220 overlaps a slanted boundary (i.e., the sixth boundary) 216b of the third region 216 while the fourth portion 234 of the second gate structure 230 overlaps another slanted boundary (i.e., the eighth boundary) 218b of the fourth region 218. In some embodiments, the first gate structure 220 and the second gate structure 230 are point symmetrical with respect to a central point CP, but the disclosure is not limited thereto. Additionally, the first portion 222 of the first gate structure 220 can further overlap a portion of the second region 214, and the third portion 232 of the second gate structure 230 can further overlap a portion of the second region 214 in some embodiments. In some embodiments, the first portion 222 and the second portion 224 of the first gate structure 220 can further overlap a portion of the first region 212-1, and the third portion 232 and the fourth portion 234 of the second gate structure 230 can further overlap a portion of the first region 212-2.

Still referring to FIG. 8, the first portion 222 of the first gate structure 220 and the third portion 232 of the second gate structure 230 include a first distance d1 therebetween. The first portion 222 of the first gate structure 220 and the fourth portion 234 of the second gate structure 230 include a second distance d2 therebetween. The second portion 224 of the first gate structure 220 and the third portion 232 of the second gate structure 230 include a third distance d3 therebetween. In some embodiments, the first distance d1 is greater than the second distance d2, and the first distance d1 is greater than the third distance d3. In some embodiments, the second distance d2 is equal to the third distance d3.

According to the semiconductor layout structure 200, each of the first gate structure 220 and the second gate structure 230 forms a transistor device with the source/drain regions 240S/240D disposed at its two sides. Thus, at least two transistor devices including the L-gate structures are obtained. Accordingly, the transistor devices provide the advantages of lower leakage currents and higher driving currents as mentioned above. Further, since the first gate structure 220 and the second gate structure 230 are point symmetric, distance between the two gate structures 220 and 230 can be reduced as long as the second distance d2 and the third distance d3 do not violate design rules. Therefore, a total area occupied by the semiconductor layout structure 200 can be easily reduced by layout optimization to achieve reduction in device size.

Figure 9:
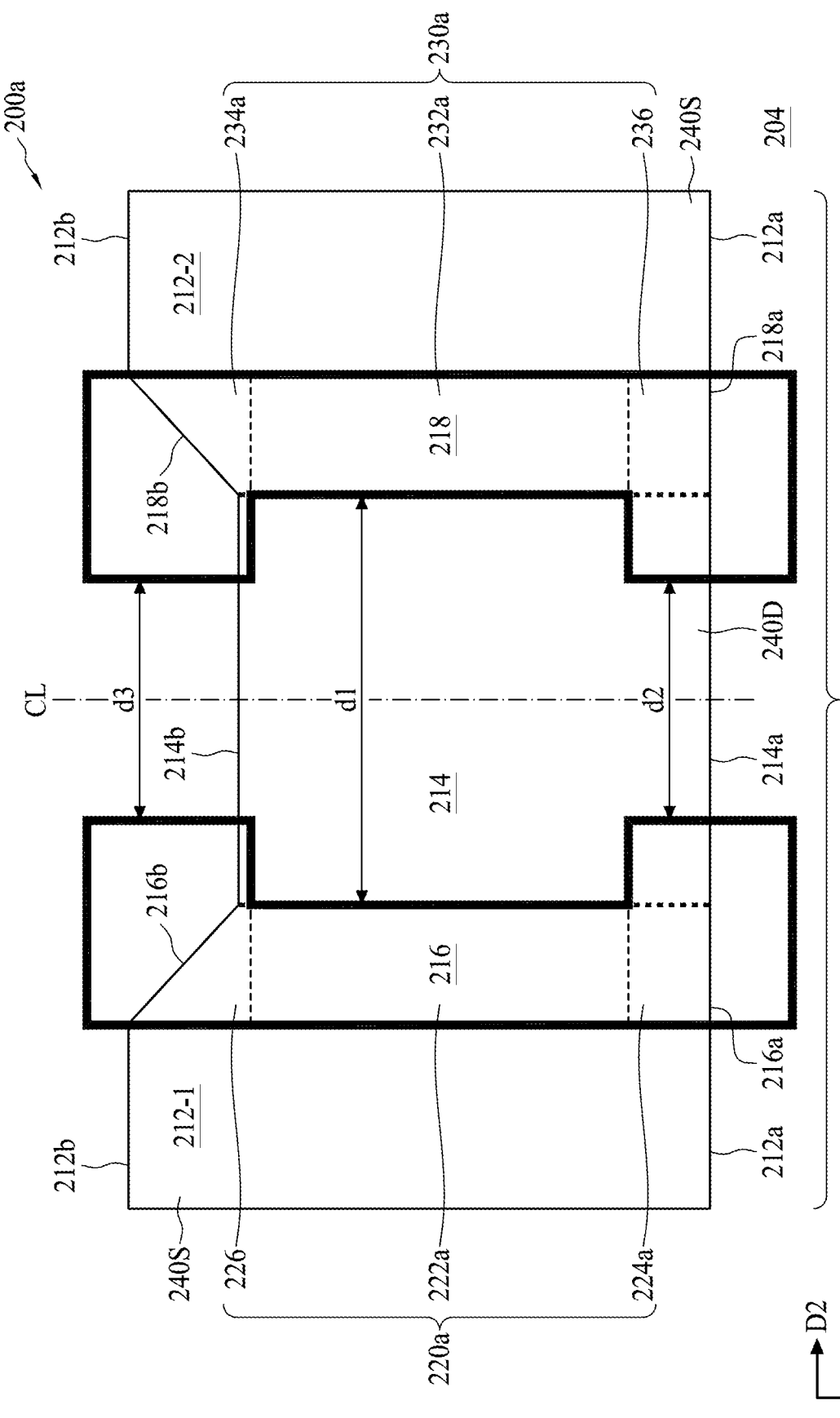
FIG. 9 is a schematic drawing illustrating the semiconductor layout structure in accordance with some embodiments of the present disclosure.

FIG. 9 is a schematic drawing illustrating a semiconductor layout structure 200a in accordance with some embodiments of the present disclosure. It should be noted that same elements in FIGS. 8 and 9 are designated by the same numerals and can be formed by same processes, and such elements are omitted in the interest of brevity. In some embodiments of the present disclosure, the semiconductor layout structure 200a includes an active region 210 surrounded by an isolation structure 204. The active region 210, as mentioned above, can be an n-type or a p-typed doped region, depending on the conductivity type of the semiconductor layout structure 200a. As mentioned above, the active region 210 includes two first regions 212-1 and 212-2 including the first length L1, the second region 214 disposed between the two first regions 212-1 and 212-2 and including the second length L2 less than the first length L1, the third region 216 disposed between the second region 214 and the first region 212-1, and the fourth region 218 disposed between the second region 214 and the first region 212-2.

The semiconductor layout structure 200a includes at least one first gate structure 220a disposed over the active region 210 and the isolation structure 204, at least one second gate structure 230a disposed over the active region 210 and the isolation structure 204, and a plurality of source/drain regions 240S/240D disposed in the active region 210. As mentioned above, the source/drain regions 240S/240D can be n-type or p-type doped region, depending on the conductivity type of the semiconductor layout structure 200a. The first gate structure 220a includes a first portion 222a extending in the first direction D1 and a second portion 224a extending in the second direction D2. In other words, the first portion 222a of the first gate structure 220a and the second portion 224a of the first gate structure 220a are perpendicular to each other. The second gate structure 230a includes a third portion 232a parallel to the first portion 222a and a fourth portion 234a parallel to the second portion 224a. In some embodiments of the present disclosure, the first gate structure 220a further includes a fifth portion 226, and the second gate structure 230a further includes a sixth portion 236. The second portion 224a and the fifth portion 226 are disposed at two opposite ends of the first portion 222a, and are both physically in contact with the first portion 222a. The fourth portion 234a and the sixth portion 236 are disposed at two opposite ends of the third portion 232a, and are both physically in contact with the third portion 232a. Accordingly, the first gate structure 220a and the second gate structure 230a are C-gate structures. In some embodiments, widths of the second portion 224a and the fifth portion 226 of the first gate structure 220a are greater than a width of the first portion 222a of the first gate structure 220a, and widths of the fourth portion 234a and the sixth portion 236 of the second gate structure 230a are greater than a width of the third portion 232a of the second gate structure 230a. In some embodiments, the width of the first portion 222a of the first gate structure 220a is equal to the width of the third portion 232a of the second gate structure 230a, but the disclosure is not limited thereto. In some embodiments, the widths of the second portion 224a and the fifth portion 236 of the first gate structure 220a are equal to the widths of the fourth portion 234a and the sixth portion 236 of the second gate structure 230a, but the disclosure is not limited thereto.

In some embodiments, the second portion 224a of the first gate structure 220a overlaps a portion of the third region 216, a portion of the second region 214 and a portion of the isolation structure 204. The fourth portion 234a of the second gate structure 230a overlaps a portion the fourth region 218, a portion of the second region 214 and a portion of the isolation structure 204. The first portion 222a of the first gate structure 220a overlaps only the third region 216, and the third portion 232a of the second gate structure 230a overlaps only the fourth region 218. In some embodiments, the fifth portion 226 of the first gate structure 220a overlaps a portion of the third region 216, a portion of the second region 214, and a portion of the isolation structure 204, but the disclosure is not limited thereto. In some embodiments, the sixth portion 236 overlaps a portion of the fourth region 218, a portion of the second region 214, and a portion of the isolation structure 204. Further, the fifth portion 226 of the first gate structure 220a overlaps a slanted boundary (i.e., the sixth boundary) 216b of the third region 216 while the fourth portion 234a of the second gate structure 230a overlaps another slanted boundary (i.e., the eighth boundary) 218b of the fourth region 218. In some embodiments, the first gate structure 220a and the second gate structure 230a are line symmetrical with respect to a central line CL, but the disclosure is not limited thereto. In some embodiments, the two first regions 212-1 and 212-2 are line symmetrical with respect to a central line CL. In some embodiments, the third region 216 and the fourth region 218 are also line symmetrical with respect to a central line CL. Additionally, the first portion 222a of the first gate structure 220a can further overlap a portion of the second region 214, and the third portion 232a of the second gate structure 230a can further overlap a portion of the second region 214 (not shown) in some embodiments. In some embodiments, the first gate structure 220a (including the first portion 222a, the second portion 224a and the fifth portion 226) can further overlap a portion of the first region 212-1, but the disclosure is not limited thereto. In some embodiments, the second gate structure 230a (including the third portion 232a, the fourth portion 234a and the sixth portion 236) can further overlap a portion of the first region 212-2, but the disclosure is not limited thereto.

Still referring to FIG. 9, the first portion 222a of the first gate structure 220a and the third portion 232a of the second gate structure 230a include a first distance d1 therebetween. The second portion 224a of the first gate structure 220a and the sixth portion 236 of the second gate structure 230a include a second distance d2 therebetween. The fifth portion 226 of the first gate structure 220a and the fourth portion 234a of the second gate structure 230a include a third distance d3 therebetween. In some embodiments, the first distance d1 is greater than the second distance d2, and the first distance d1 is greater than the third distance d3. In some embodiments, the second distance d2 is equal to the third distance d3.

According to the semiconductor layout structure 200a, each of the first gate structure 220a and the second gate structure 230a forms a transistor device with the source/drain regions 240S/240D disposed at its two sides. Thus, at least two transistor devices including the C-gate structures are obtained. Accordingly, the transistor devices provide the advantages of lower leakage currents and higher driving currents as mentioned above. Further, since the first gate structure 220a and the second gate structure 230a are line symmetric, distance between the two gate structures 220a and 230a can be reduced as long as the second distance d2 and the third distance d3 do not violate design rules. Therefore, a total area occupied by the semiconductor layout structure 200a can be easily reduced by layout optimization to achieve reduction in device size.

In the present disclosure, the transistor devices 100, 100a and 100b including the L-gate structure 120, 120a and 120b, and the transistor device 100c including the C-gate structure 100c are provided. Consequently, the concentrated electric field is deflected from the main channel region 150, 150a, 150b and 150c, and thus leakage current is reduced. Further, the third region 116 includes the slanted boundary, and thus different channel lengths are formed. Accordingly, drain current (Ids) is increased, and off current (Ioff) is reduced. In other words, driving current is improved and leakage current is reduced. Consequently, performance of the transistor device is improved while power consumption of the transistor device is reduced. Further, the semiconductor layout structures 200 and 200a are provided. The semiconductor layout structure 200 includes two L-gate structures 220 and 230 that are point symmetrical, and the semiconductor layout structure 200a includes two C-gate structures 220a and 230a that are line symmetrical. Consequently, a total area occupied by the semiconductor layout structure 200 or 200a can be easily reduced by layout optimization to achieve reduction in device size.

In contrast, with a comparative transistor device or semiconductor layout structure including a straight gate structure, the device suffers from greater leakage current and thus higher power consumption. Further, with a comparative transistor device or semiconductor layout structure including the channel region with only one length, the drain current is relatively lower. The transistor device therefore suffers from inferior performance.

One aspect of the present disclosure provides a transistor device. The transistor device includes an active region disposed in a substrate, a gate structure disposed over the active region, and a source/drain region disposed at two opposite sides of the gate structure. The active region includes a first region, a second region and a third region between the first region and the second region. The first region includes a first length, the second region includes a second length, and the first length is greater than the second length. The gate structure includes a first portion extending in a first direction and a second portion extending in a second direction. The first direction and the second direction are perpendicular to each other. The first portion of the gate structure is disposed over at least the third region of the active region, and the second portion of the gate structure is disposed over at least a portion of the third region and a portion of the second region.

One aspect of the present disclosure provides a semiconductor layout structure. The semiconductor layout structure includes an active region surrounded by an isolation structure, at least one first gate structure disposed over the active region and the isolation structure, at least one second gate structure disposed over the active region and the isolation structure, and a plurality of source/drain regions disposed in the active region. The active region includes two first regions, a second region disposed between the two first regions, a third region disposed between one of the first region and the second region, and a fourth region disposed between the other first region and the second region. The first regions include a first length, the second region includes a second length, and the second length is less than the first length. The first gate structure includes a first portion and a second portion perpendicular to each other. The second gate structure includes a third portion parallel to the first portion and a fourth portion parallel to the second portion. The second portion of the first gate structure overlaps the third region and a portion of the second region. The fourth portion of the second gate structure overlaps the fourth region and a portion of the second region.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended, to include within their scope such processes, machines, manufacture, compositions of matter, means, methods, or steps.

What is claimed is:

1. A semiconductor layout structure comprising:
an active region surrounded by an isolation structure, the active region comprising:
two first regions comprising a first length;
a second region disposed between the two first regions, the second region comprising a second length less than the first length;
a third region disposed between one of the first regions and the second region; and
a fourth region disposed between the other of the first regions and the second region;
at least one first gate structure disposed over the active region and the isolation structure, the first gate structure comprising a first portion and a second portion perpendicular to each other;
at least one second gate structure disposed over the active region and the isolation structure, the second gate structure comprising a third portion parallel to the first portion and a fourth portion parallel to the second portion; and
a plurality of source/drain regions disposed in the active region,
wherein the second portion of the first gate structure overlaps the third region and a portion of the second region, and the fourth portion of the second gate structure overlaps the fourth region and a portion of the second region.

2. The semiconductor layout structure of claim 1, wherein the first gate structure and the second gate structure are point symmetrical with respect to a central point.

3. The semiconductor layout structure of claim 1, wherein the first portion of the first gate structure and the third portion of the second gate structure comprise a first distance therebetween, the first portion of the first gate structure and the fourth portion of the second gate structure comprise a second distance therebetween, the second portion of the first gate structure and the third portion of the second gate structure comprise a third distance therebetween, the first distance is greater than the second distance, the first distance is greater than the third distance, and the second distance is equal to the third distance.

4. The semiconductor layout structure of claim 1, wherein the first portion of the first gate structure overlaps the third region, and the third portion of the second gate structure overlaps the fourth region.

5. The semiconductor layout structure of claim 4, wherein the first portion of the first gate structure overlaps a slanted boundary of the third region, and the fourth portion of the second gate structure overlaps a slanted boundary of the fourth region.

6. The semiconductor layout structure of claim 1, wherein the first gate structure further comprises a fifth portion overlapping the third region and a portion of the second region, and the second gate structure further comprises a sixth portion overlapping the fourth region and a portion of the second region.

7. The semiconductor layout structure of claim 6, wherein the first gate structure and the second gate structure are line symmetrical with respect to a central line, the two first regions are line symmetrical with respect to a central line, and the third region and the fourth region are line symmetrical with respect to a central line.

8. The semiconductor layout structure of claim 6, wherein the first portion of the first gate structure and the third portion of the second gate structure comprise a first distance therebetween, the second portion of the first gate structure and the sixth portion of the second gate structure comprise a second distance therebetween, the fifth portion of the first gate structure and the fourth portion of the second gate structure comprise a third distance therebetween, the first distance is greater than the second distance, the first distance is greater than the third distance, and the second distance is equal to the third distance.

* * * * *